(12) United States Patent
Yao et al.

(10) Patent No.: US 6,762,613 B1
(45) Date of Patent: Jul. 13, 2004

(54) TESTING SYSTEM AND METHOD OF OPERATION THEREFOR INCLUDING A TEST FIXTURE FOR ELECTRICAL TESTING OF SEMICONDUCTOR CHIPS ABOVE A THERMAL THRESHOLD TEMPERATURE OF AN INTERLAYER DIELECTRIC MATERIAL

(75) Inventors: Huade Walter Yao, Livermore, CA (US); Kurt Owen Taylor, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 3 days.

(21) Appl. No.: 10/305,225

(22) Filed: Nov. 25, 2002

(51) Int. Cl.[7] ............................................. G01R 31/02
(52) U.S. Cl. .................................. 324/760; 324/341
(58) Field of Search ................................. 324/760, 431, 324/441, 224, 670, 685, 721, 663, 341; 257/524, 508

(56) References Cited

U.S. PATENT DOCUMENTS 5,438,022 A * 8/1995 Allman et al. ............... 438/763
6,504,249 B1 * 1/2003 Allman et al. ............... 257/758

* cited by examiner

Primary Examiner—David A. Zarneke
Assistant Examiner—Trung Q Nguyen
(74) Attorney, Agent, or Firm—Mikio Ishimaru

(57) ABSTRACT

A testing system and method of operation therefor is provided including a test fixture for electrical testing above a thermal threshold temperature of a low dielectric constant material and having a test-chip-die-sized enclosed volume. The test fixture has an electrical connection from the enclosed volume to the outside thereof and a removable lid for sealing the enclosed volume in the test fixture.

10 Claims, 2 Drawing Sheets

TESTING SYSTEM AND METHOD OF OPERATION THEREFOR INCLUDING A TEST FIXTURE FOR ELECTRICAL TESTING OF SEMICONDUCTOR CHIPS ABOVE A THERMAL THRESHOLD TEMPERATURE OF AN INTERLAYER DIELECTRIC MATERIAL

TECHNICAL FIELD

The present invention relates generally to reliability testing of semiconductor integrated circuit materials, and more specifically to advanced processes for reliability testing of low dielectric constant interlayer dielectric (ILD) materials.

BACKGROUND ART

To reduce qualification times for production products, the semiconductor industry relies heavily on time dependent, thermally accelerated stress and failure testing techniques to test new materials and new semiconductor structures. As these structures become ever smaller and the features ever thinner, as the devices are increasingly made of ever more exotic combinations of conductor and insulator materials, and as times-to-market get ever shorter and shorter, such thermally accelerated testing techniques are not only valuable, but in fact they have become essential.

Advances in the art of semiconductor processing have dramatically increased the number of functional elements on a semiconductor chip. This has been accomplished in some cases by increasing the size of the chip, but more often and more importantly by reducing the size of the minimum features on the chip. Where a one-micron design rule was once considered a challenge, sizes a full order of magnitude smaller are now typical, and the trend is continuing. The dielectric layers that separate and insulate these features from one another are similarly being scaled down in thickness and lateral dimension. Additionally, with the advent of newer materials, copper/interlayer dielectric integrated systems are increasingly required to reduce resistance/capacitance (RC) delay. The thinness and close proximity of these layers further require that they be made of low dielectric constant (low-k) dielectric materials having dielectric constants well under 3.9. The physical characteristics of these materials make the qualification of such copper/low dielectric constant interlayer dielectric integrated systems and the prediction of their lifetime reliabilities extremely important.

Improvements in processing have also made dielectric layer lifetimes increase, which increases the time and sample sizes needed to test and qualify new processes and materials. This conflicts with the continuing need to reduce design cycle times due to ever-increasing competition in the semiconductor industry. Accelerated stress testing is therefore critical in reducing the time to observe failures, with elevated temperatures being employed as a principle factor in accelerating the failure of a specific target fraction of the test population. Many chemical and physical processes leading to failure are accelerated by temperature in ways that can be readily modeled and reproduced in known fashion.

Each incremental reduction in testing time requires a higher test temperature, which in turn places an increased burden on the entire accelerated failure testing process. Low-k interlayer dielectric (ILD) materials, for example, are a critical component for the modem high-speed microprocessor.

It has been found that the conventional thermal stress for reliability tests cannot in general be directly applied to low-k ILD materials for reliability experiments at contemporary testing temperatures (e.g., T>300° C.). For example, SiLK (TM of Dow Chemical Co.) ILD and copper conductor combinations will be damaged at 350° C. in air.

Thus, whereas conventional dielectric materials and test circuit structures are routinely tested on equipment using a standard test fixture, it was discovered that this same equipment could not be used for low-k dielectric materials because the low-k materials were unexpectedly vaporized or otherwise damaged by oxidation during the accelerated life tests at above their thermal threshold temperatures (TTT). This was believed to be due to the nature of porosity and low mechanical modulus of such materials, which could cause minute electrical concentrations that would cause small-scale or large-scale vaporizations and oxidations.

A solution to this problem has been long sought, but has long eluded those skilled in the art.

DISCLOSURE OF THE INVENTION

The present invention provides a testing system and method of operation therefor including a test fixture for electrical testing above interlayer dielectric thermal threshold temperatures (TTT) having an integrated-circuit-sized enclosed volume. The test fixture has an electrical connection from the enclosed volume to the outside thereof and a removable lid for sealing the enclosed volume in the test fixture. This allows testing equipment to be used for low-k dielectric materials without having the low-k materials unexpectedly vaporized or otherwise oxidized during accelerated life tests at above TTT, e.g., for SiLK low-k ILD, 300° C.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Structure

Figure 1:
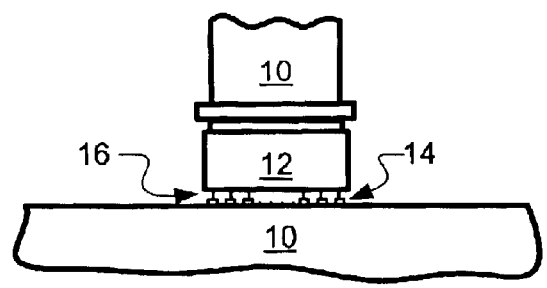
FIG. 1 is a partial elevation of testing equipment for holding a test fixture constructed according to the present invention.

Referring now to FIG. 1, therein is shown a partial elevation of testing equipment 10 for holding a test fixture 12 constructed according to the present invention. The testing equipment 10 has electrical contact sockets 14, which receive and connect to contact pins 16 at the bottom of the test fixture 12.

The term "horizontal" as used in herein is defined as a plane parallel to the conventional plane or surface of the test fixture 12, regardless of its orientation. The term "vertical" refers to a direction perpendicular to the horizontal as just defined. Terms, such as "on", "above", "below", "bottom", "top". "side" (as in "side wall"), "higher", "lower", "over", and "under", are defined with respect to the horizontal plane.

The testing equipment 10 can be used to perform various tests where electrical contact with the test fixture 12 is required, including but not limited to performing electromigration (EM), bias thermal stress (BTS), and/or stress migration (SM) reliability testing. Further, the testing equipment can be equipped to provide a high ambient temperature and/or high voltages and/or currents to the test fixture 12.

Figure 2:
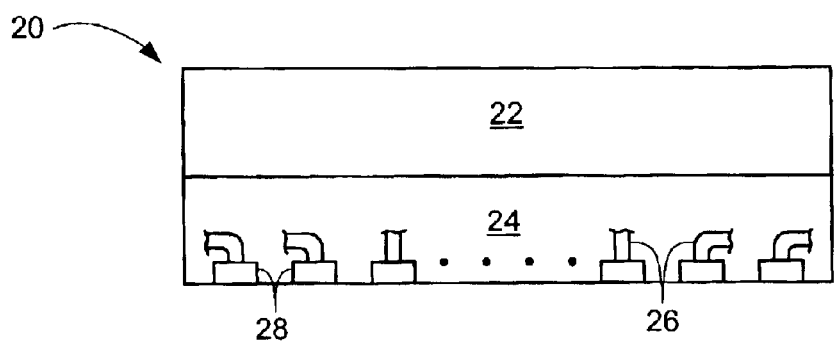
FIG. 2 is a schematic cross-sectional view of a test sample.

Referring now to FIG. 2, therein is shown a schematic cross-sectional view of a test sample 20. The test sample 20 can be of any sort where electrical contact is required.

In one embodiment, the test sample 20 includes a substrate 22 and a low dielectric constant (low-k) material 24 deposited on the substrate 22. The low-k material 24 would be the material actually under test and could be of different formulations, structures, shapes, etc.

In the one embodiment shown, the low-k material 24 has embedded wires and vias 26, which simulate the actual wires and vias in an actual integrated circuit. The wires and vias 26, shown illustratively, connect internally in a known fashion in various material test configurations (not shown) where the wires and vias 26 are separated by layers of the low-k material 24 and barrier layers (not shown) for testing of novel copper (Cu)/low-k materials.

As would be evident from this disclosure, various different conductive metals could also be tested. In the one embodiment shown, the conductive metal would be copper or its alloys with various barrier metals and compounds.

As would also be evident from this disclosure, different structures such as ultra-low-k materials made of aerogels could also be tested. For the purposes of the present invention, ultra-low-k materials are considered as included in the class of low-k dielectric materials.

The wires and vias 26 in the test sample 20 are connected to contact pads 28 for the input and output of test voltages and currents to the test sample 20. Since the test sample 20 is generally integrated circuit chip-sized, the contact pads 28 are extremely close together.

The distance between the contact pads 28 in the test sample 20 are generally so small that it is very difficult for conventional dielectric material testing equipment to contact them for access to the wires and vias 26.

Figure 3:
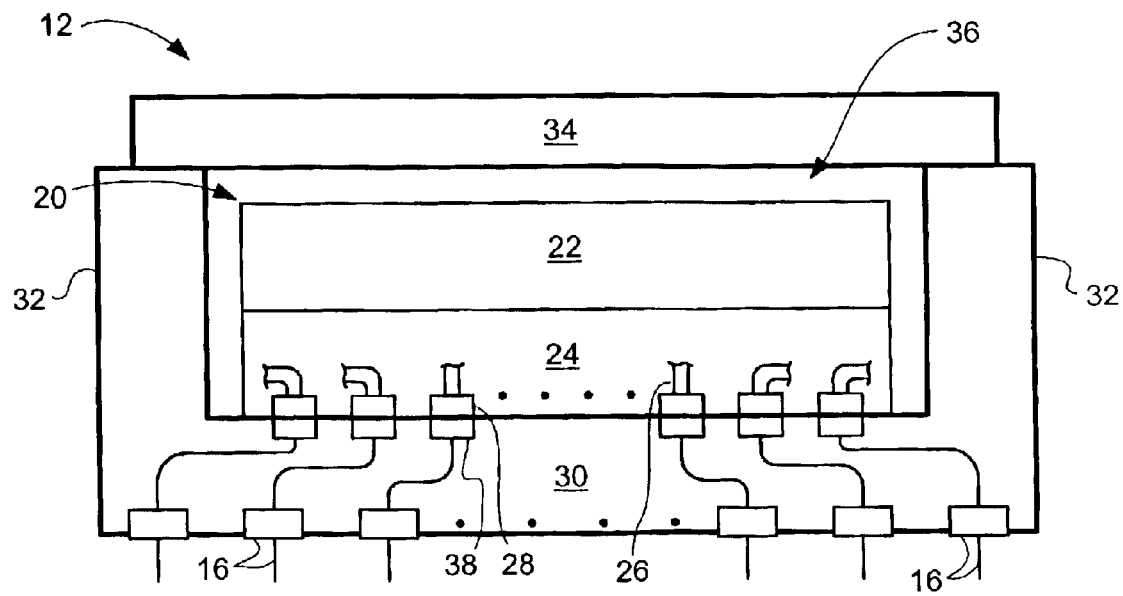
FIG. 3 is a cross-sectional view showing the test fixture and the test sample according to the present invention.

Referring now to FIG. 3, therein is shown a cross-sectional view showing the test fixture 12 and the test sample 20 according to the present invention. The test fixture 12 forms a sample-testing package having a base 30 and sidewalls 32, which form an enclosed volume for receiving the test sample 20. The top of the sidewalls 32 are finished, or provided with a seal, capable of forming a gas-tight seal when a removable lid 34 is seated on the top of the sidewalls 32. When the removable lid 34 is in place, the base 30, the sidewalls 32, and the removable lid 34 form a gas-tight enclosed volume 36.

Base contacts 38 are provided on the inside top of the base 30 of the test fixture 12. The base contacts 38 are spaced apart to match the contact pads 28. The contact pads 28 and the base contacts 38 may rest in electrical contact but are preferably soldered together to form the electrical contact. Where the spacing of the contact pads 28 is extremely tight, ball grid array connections could be used with the base contacts 38.

Since it is desirable for the test fixture 12 to be configured for use with the testing equipment 10. The base contacts 38, as shown, are connected electrically to the contact pins 16, which are spread out to match the configuration of the testing equipment 10.

Thus, the wires and vias 26 of the test sample 20 are provided with external electrical connectivity with the electrical contact sockets 14 of the testing equipment 10.

It will be understood, of course, that electrical contacts and connections can also or alternatively be provided through the sidewalls 32 and/or the removable lid 34 as may be desired.

Problems

As previously explained, it has been found that the conventional thermal stress for reliability tests cannot in general be directly applied to low-k ILD materials for reliability experiments at contemporary testing temperatures (e.g., T>300° C.). For example, SiLK (TM of Dow Chemical Co.) ILD and copper conductor combinations will be damaged at 350° C.

Whereas conventional dielectric materials (e.g., $SiO_2$ having dielectric constants above 3.9) and test circuit structures are routinely tested on equipment using a standard test fixture, it was unexpectedly discovered that this same equipment could not be used for low-k dielectric materials (having dielectric constants under 3.9), especially the ultra low-k ILD (having dielectric constant under 3.0), because the low-k materials were vaporized or otherwise damaged via oxidation during the accelerated life tests at above their thermal threshold temperatures (TTT). This was believed to be due to the nature of the porosity and low mechanical modulus of such materials, which could cause disassociation and oxidation of the dielectric materials under high temperatures.

Extensive research determined that the vaporizations or damage were caused by the test samples being exposed to oxygen in the air around the testing equipment and the test samples were violently oxidized in the air above their TTT.

Those skilled in the art attempted a number of different solutions, which all had problems.

While it was possible to seal the entire assembly of testing equipment to exclude atmospheric exposure, such a solution was expensive, would require equipment modifications, and would prove considerably inconvenient in moving material between different sealed testers. The tests could only be performed in a batch mode because of the need to break vacuum in order to insert test samples and then go through the time consuming process of building up the vacuum to test levels.

The use of testing equipment using inert or nitrogen atmospheres was subject to substantially the same problems.

Another solution, encapsulating the sample test material, i.e., using die seals, while less expensive, was nevertheless still too expensive because electrical leads are required to the wires and vias inside the test material. Thus, connections and seals would be required to the material's pads, which are connected to the wires and vias inside the material, thereby requiring a full integrated circuit package.

Further, encapsulating the test sample effectively into an integrated circuit package would make subsequent examination of the test results difficult and inconvenient due to the need to break into the sealed encapsulation package without damaging the test sample.

These limitations present immediate problems for performing reliability tests of low-k materials (e.g., Cu/low-k ILD systems) at temperatures in this now-customary range.

Solutions

The present invention provides a solution to the aforementioned problems by disclosing a test fixture and method adapted to accelerate time dependent dielectric breakdown testing by raising the upper limit of testing to above the TTT without extraneously damaging the low-k ILD materials and without requiring special, elaborate testing equipment and procedures. Having discovered that atmospheric testing (testing in an oxygen atmosphere) was causing the failures of the conventional reliability testing procedures, it was realized that it was therefore necessary to test the low-k ILD materials in a vacuum or an inert gas when testing at temperatures above their TTT. For example, while Cu/low-k SiLK ILD/Cu systems will be damaged at above 300° C. when baked in air, such systems test satisfactorily when heated in a vacuum.

The optimal solution discovered is to modify the test fixture rather than the testing equipment. The test fixture 12 is configured with the sidewalls 32 and provided with the removable lid 34 for creating the gas-tight enclosed volume 36 for sealing the test sample 20. The enclosed volume 36 is test-chip-die-sized, which means there is little extra volume around the test sample 20 so any air in the test fixture 12 can easily be replaced by a vacuum or an inert gas.

The test sample 20 is then attached or bonded with the base contacts 38 for electrical connection to the external contact pins 16 of the test fixture 12. The open test fixture 12 is then inserted in a vacuum or inert gas atmosphere and the removable lid 34 is put in place. This leaves the gas-tight enclosed volume 36 containing the vacuum or filled with the inert gas, such as nitrogen or argon. This provides a convenient, sealed, nearly oxygen-free sample testing package that can be used directly with existing, unmodified testing equipment. The test fixture 12 can also be moved from testing equipment to testing equipment with out a concern that the testing equipment needs to be especially equipped for an oxygen-free atmosphere.

The test fixture 12, by means of the contact pins 16, is then plugged into the contact sockets 14 (FIG. 1) on the testing equipment 10. Testing procedures can then be conducted on the test sample 20 at high temperature (e.g., 350° C.), for example, for electromigration (EM), bias thermal stress (BTS), and stress migration (SM) reliability.

Figure 4:
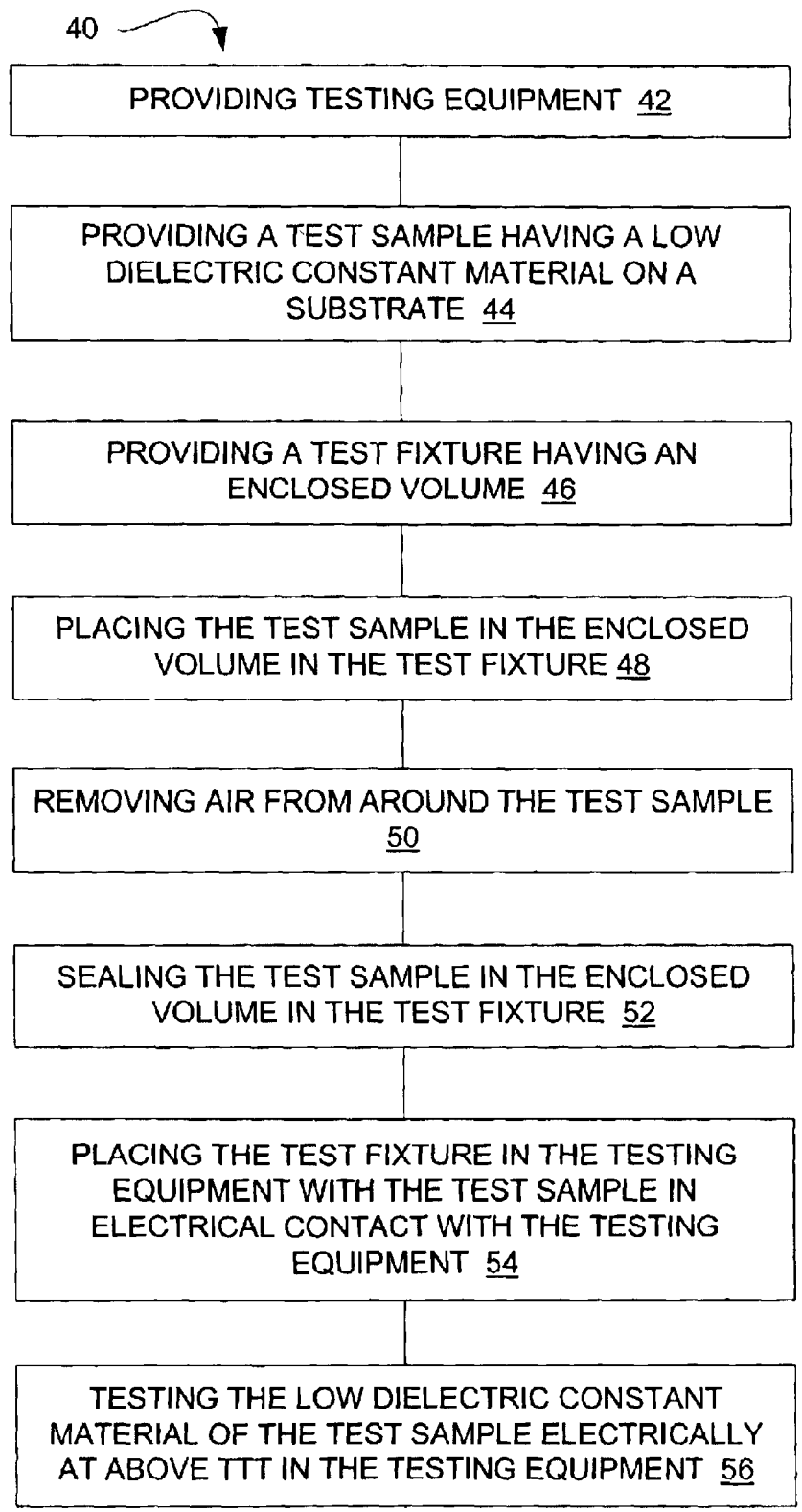
FIG. 4 is a simplified flow chart of the method of operation in accordance with the present invention.

Referring now to FIG. 4, therein is shown a simplified flow chart of a method 40 of operation in accordance with the present invention. The method of testing includes: a step 42 of providing testing equipment; a step 44 of providing a test sample having a low dielectric constant material on a substrate; a step 46 of providing a test fixture having an enclosed volume; a step 48 of placing the test sample in the enclosed volume in the test fixture; a step 50 of removing air from around the test sample; a step 52 of sealing the test sample in the enclosed volume in the test fixture; a step 54 of placing the test fixture in the testing equipment with the test sample in electrical contact with the testing equipment; and a step 56 of testing the low dielectric constant material of the test sample electrically at above TTT in the testing equipment.

The advantages of the present invention are significant. The method and apparatus it teaches importantly provide an economical and quick way to transition existing reliability testing systems into tools capable of doing accelerated thermal reliability tests for Cu/low-k ILD devices. The invention avoids making expensive and time-consuming changes to reliability testing tools and labs in which the entire testing equipment (e.g., the testing equipment 10) would have to be placed in vacuum or inert gases. It additionally provides for using current, existing test masks to perform the desired reliability tests for Cu/low-k ILD systems, without reconstructing the test mask structures with die seals.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method of testing comprising:

providing testing equipment;

providing a test sample having a low dielectric constant material on a substrate;

providing a test fixture having an enclosed volume;

placing the test sample in the enclosed volume in the test fixture;

removing air from around the test sample;

sealing the test sample in the enclosed volume in the test fixture;

placing the test fixture in the testing equipment with the test sample in electrical contact with the testing equipment; and testing the low dielectric constant material of the test sample electrically at above the thermal threshold temperatures of the low dielectric constant material in the testing equipment.

2. The method of testing as claimed in claim 1 wherein:

removing air includes: providing a vacuum around the test sample.

3. The method of testing as claimed in claim 1 wherein:

removing air includes providing an inert gas around the test sample.

4. The method of testing as claimed in claim 1 wherein:

testing includes a test of a SiLK low dielectric constant interlayer dielectric material where the thermal threshold temperature is about 300° C.

5. The method of testing as claimed in claim 1 wherein:

testing includes a test selected from a group consisting of electromigration, bias thermal stress, stress migration reliability, and elevated temperature reliability tests.

6. A method of testing comprising:

providing testing equipment having an electrical contact socket thereon;

providing a test sample having a low dielectric constant material on a substrate, the low dielectric constant material having a contact pad with a wire and a via connected thereto;

providing a test fixture having an enclosed volume with a base contact therein connected to a contact pin in the test fixture extending outward therefrom;

placing the test sample in the enclosed volume in the test fixture with the contact pad in electrical contact with the base contact;

removing oxygen from around the test sample in the enclosed volume in the test fixture;

sealing the test sample in the enclosed volume in the test fixture;

placing the test fixture in the testing equipment with the contact pin in electrical contact with the electrical contact socket;

heating the test sample above a thermal threshold temperature; and testing the low dielectric constant material of the test sample electrically at above the thermal threshold temperature in the testing equipment.

7. The method of testing as claimed in claim 6 wherein:

removing oxygen includes providing a vacuum around the test sample.

8. The method of testing as claimed in claim 6 wherein:
removing oxygen includes providing an inert gas around the test sample.

9. The method of testing as claimed in claim 6 wherein:
testing includes a test of a SiLK interlayer dielectric material where the thermal threshold temperature is about 300° C.

10. The method of testing as claimed in claim 6 wherein:
testing includes a test selected from a group consisting of electromigration, bias thermal stress, stress migration reliability, and elevated temperature reliability tests.

* * * * *